(12) United States Patent
Vail et al.

(10) Patent No.: US 9,090,743 B2
(45) Date of Patent: Jul. 28, 2015

(54) METALLOPORPHYRIN POLYMER FUNCTIONALIZED SUBSTRATE

(71) Applicant: Sharp Laboratories of America, Inc., Camas, WA (US)

(72) Inventors: Sean Andrew Vail, Vancouver, WA (US); David R. Evans, Beaverton, OR (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 129 days.

(21) Appl. No.: 13/952,535

(22) Filed: Jul. 26, 2013

(65) Prior Publication Data

US 2015/0005464 A1    Jan. 1, 2015

Related U.S. Application Data

(63) Continuation-in-part of application No. 13/930,120, filed on Jun. 28, 2013.

(51) Int. Cl.
 *C08G 18/00* (2006.01)
 *C08G 79/00* (2006.01)
 *H01L 51/00* (2006.01)

(52) U.S. Cl.
 CPC ............ *C08G 79/00* (2013.01); *H01L 51/0077* (2013.01); *C08G 2261/314* (2013.01); *C08G 2261/91* (2013.01); *Y02E 10/549* (2013.01)

(58) Field of Classification Search
 CPC .......... H01L 51/0077; C08G 2261/91; C08G 2261/314; Y02E 10/549
 See application file for complete search history.

(56) References Cited

PUBLICATIONS

Lin et al. (Science, 264, 5162,pp. 1105-1111, 1994).*

* cited by examiner

*Primary Examiner* — Shane Fang
(74) *Attorney, Agent, or Firm* — Law Office of Gerald Maliszewski; Gerald Maliszewski

(57) ABSTRACT

A method is provided for fabricating a metalloporphyrin polymer on a substrate. The method creates a functionalized substrate by attaching an anchor group of a linker, including a terminal alkyne group, to a substrate surface. The functionalized substrate is then exposed to metalloporphyrin monomers, where each metalloporphyrin monomer includes at least two terminal alkyne groups. A plurality of metalloporphyrin monomers (e.g., zinc porphyrin monomers) are thus linked via the metalloporphyrin monomer terminal alkyne groups, forming a metalloporphyrin polymer attached to the substrate. In one aspect, linking the plurality of metalloporphyrin monomers via the metalloporphyrin monomer terminal alkyne groups includes forming butadiyne groups between adjacent metalloporphyrins. Then, forming the metalloporphyrin polymer attached to the substrate includes attaching the metalloporphyrin polymer, via a metalloporphyrin monomer terminal alkyne group, to the terminal alkyne group of an associated linker. Alternatively stated, the metalloporphyrin polymer is attached to the substrate via a polyalkyne group.

10 Claims, 8 Drawing Sheets

METALLOPORPHYRIN POLYMER FUNCTIONALIZED SUBSTRATE

RELATED APPLICATIONS

This application is a Continuation-in-part of a patent application entitled, FACILE SYNTHESIS OF METALLOPORPHYRIN POLYMERS, invented by Sean Vail et al., Ser. No. 13/930,120, filed Jun. 28, 2013, which is incorporated herein by reference.

BACKGROUND OF THE INVENTION

1. Field of the Invention

This invention generally relates to light harvesting porphyrin polymer materials and, more particularly, to a method for functionalizing a substrate with a metalloporphyrin polymer.

2. Description of the Related Art

Natural photosynthesis is the process that converts visible light into chemical energy. Chlorophyll a and b function as the dominant molecular light-harvesting "absorbers" in the photosynthetic reaction center (PRC) and exhibit complementary absorption characteristics in the wavelength range of less than 400 to about 700 nanometers (nm). Overall, the process is initiated with the absorption of light by a photosynthetic chromophore that functions as a molecular antenna for harvesting light. Cyclic tetrapyrroles (i.e., chlorophylls and porphyrins) act as efficient antennas due to their ability to absorb light throughout the visible spectrum. Noteworthy is the fact that the unique, three-dimensional architecture of the PRC permits the initial photophysical events to proceed with quantum efficiencies approaching unity.

FIG. 1 is a simplified schematic of a dye-sensitized solar cell (DSC), depicting modes of operation (prior art). In many respects, DSCs operate analogously to photosynthesis and are commonly referred to in terms of artificial photosynthesis. The modes of operation are: (1) following photoexcitation (light absorption), the adsorbed photosensitizer in its ground state (S) is promoted to an electronically excited state (S*) from which electron injection into the conduction band of a large band semiconductor ($TiO_2$) occurs; (2) injected electrons diffuse through the $TiO_2$ before reaching the anode and external circuit of the cell; (3) the charge-neutral state of the photosensitzer is regenerated through a transfer of positive charge from the photosensitizer cation ($S^+$) to a liquid electrolyte following reaction with a redox couple in the solution (typically $I^-/I_3^-$); (4) finally, $I_3^-$ is reduced back to $I^-$ at the counter electrode (cathode).

FIGS. 9A and 9B respectively depict schematics of porphyrin and metalloporphyrin molecules (prior art). Porphyrins are heterocyclic macrocycles composed of four modified pyrrole subunits (a five-membered ring with the formula $C_4H_4NH$) interconnected at their a carbon atoms via methine bridges (=CH—), see FIG. 9A. Porphyrins are the conjugate acids of ligands that bind metals (M) to form complexes. The metal ion usually has a charge of 2+ or 3+, see FIG. 9B.

Although chlorophyll and its derivatives have diverse chemical structures, they exhibit characteristic absorption properties over broad wavelength ranges. In addition to their structural resemblance to natural chromophores such as chlorophyll a, synthetic porphyrins are attractive candidates as light-harvesters for photovoltaic (PV) applications due to their high structural stability, light absorption capabilities in the visible region, advantageous redox properties and synthetic accessibility as compared to naturally occurring chromophores. Investigations of photo-induced processes involving porphyrins have focused primarily on free-base ($H_2P$) and zinc porphyrins (ZnP), both of which exhibit appreciably high quantum yields. In addition, the lifetimes of their respective photo-excited states are sufficiently long to allow electron transfer (ET) to compete with internal decay processes. Electron transfer involving porphyrins is facilitated by the highly delocalized π-system, which is capable of resisting major structural changes upon oxidation. Overall, the redox properties of porphyrins and metalloporphyrins are dramatically altered upon photo-excitation, which leads to the generation of porphyrin excited states that are advantageous in PV applications.

At the present, ruthenium(II) complexes have historically proven to be among the most efficient sensitizers in dye-sensitized solar cells.[2] However, only incremental improvements in the highest power efficiencies have been achieved within the past decade. Considering the facts that ruthenium (II) dyes are expensive and ruthenium itself is a rare metal, there exists significant motivation for developing novel photosensitizers that either contain abundant, inexpensive metals or no metals at all.

The ability of porphyrins to efficiently harvest light over broad wavelength ranges has generated significant interest in their potential as light absorbing materials in solar applications over the last few decades. With respect to DSC, Yella et al. reported an exceptional power conversion efficiency (PCE) of 12.3% for a zinc porphyrin (YD2-o-C8) using co-sensitization with an organic dye (Y123) with $Co^{(II/III)}$ as redox couple.[3] Overall, synthetic protocols towards the fabrication of "customized" porphyrin architectures have become well-established and have been widely adopted as conventional methods. In general, the absorption/electronic properties of porphyrins can be readily altered using a number of strategies including the following: functionalization along the porphyrin periphery, extension of π-conjugation, insertion of transition metals into the macrocyclic core, and complexation of metalloporphyrins with various ligands, among others.

Often, the desired optical and/or electronic enhancements accessible through chemical modification of porphyrins involve manipulation of light-harvesting (absorption) capabilities and/or excited-state behaviors (electron transfer, for example). Indeed, it is well-known that increasing the π-conjugation extending from the porphyrin core can lead to enhanced absorption properties which may include: (1) increased absorptivity over a particular wavelength range, (2) a broadening of optical absorption over wider ranges and/or (3) shifting of absorption towards longer (or shorter) wavelengths. Not surprisingly, this can be accomplished through a number of synthetic strategies and may involve simple attachment of conjugated moieties to the porphyrin core unit, formation of larger, porphyrin-centered macrocycle derivatives accessible through ring-fusion reactions, or linear (or branched) poly-porphyrin architectures through which networks (dimers, trimers, tetramers, polymers) of porphyrin subunits are connected through various motifs. Most often, porphyrin dimers, trimers, and tetramers are constructed in a step-wise approach whereby single porphyrin units are added to the evolving tetramer. In these cases, the construction of the final porphyrin arrays involves: (1) synthesis of monomeric porphyrin subunits (or multiple subunits), (2) chemical reaction(s) to "link" two individual subunits, (3) purification of the new molecule and, finally, (4) a repeat of steps (1)-(3). Although precise control over subunit reactivity and overall configuration is possible, this approach is both challenging and time-consuming, while often leading to only modest quantities of final porphyrin material. Nevertheless, elaborate porphyrin architectures can indeed been realized using these methodologies.

As opposed to the integration of single (monomeric) porphyrin-based photosensitizers employed in the case of DSC applications, the fabrication of extended networks(dimers/tetramers/polymers) of porphyrin-based materials is a promising strategy for realizing strongly, broadly absorbing architectures for light absorbing applications. Indeed, a number of publications describe the enhanced absorption characteristics of extended porphyrin arrays, the most relevant of which are briefly summarized below within the context of practical application where appropriate.

Lin et al. described the synthesis and photophysical studies of conjugated acetylenic porphyrin arrays prepared through either metal-mediated and/or organometallic coupling reactions of porphyrin monomers.[4] As a result, the optical absorption properties of the dimeric (and trimeric) porphyrin arrays were significantly enhanced with respect to the corresponding monomeric porphyrins. Wagner et al. described the synthesis of phenylacetylene and phenylbutadiyne-linked porphyrin dimers and trimers using mild, copper-free conditions.[5] Therein et al. described the preparation of highly-conjugated porphyrin arrays using metal-mediated cross-coupling reactions with metalloporphyrins.[6]

In addition to the methodologies described above, Chen et al. reported the synthesis of porphyrin-containing polymers linked through triazole rings.[7] Jyothish et al. provided the preparation of a series of tris(arylmethyl)ammonium-coordinated molybdenum(VI) propylidyne catalysts that enabled the efficient synthesis of ethynylene-bridged porphyrin-based arylene ethynylene polymers through alkyne metathesis.[8] Xiang et al. described the synthesis of two conjugated polymers consisting of alternating main chain structures of zinc porphyrin-terthiophene (P-PTT) and zinc porphyrin-oligothiophene (P-POT).[9] Shi et al. provided a donor-acceptor porphyrin-containing conjugated co-polymer (PCTTQP) that exhibited broad absorption along the visible spectrum.[10] Natori et al. reported the synthesis of a tetraphenylporphyrin-end-functionalized poly(p-phenylene) exhibiting a well-controlled polymer chain structure and broad absorption across the visible region.[11] Finally, Wirotius et al. described the fabrication of dendrimer-like star-branched poly(ethylene oxide)s (PEOs) comprising two and three generations with zinc tetraphenylporphyrin (ZnTPP) moieties located at both the core and at each branching point through a convergent approach using "click" chemistry.[12]

FIGS. 2A and 2B respectively depict the molecular structures of porphyrin and porphyrin-[60]fullerene polymers fabricated via electropolymerization (prior art). An alternative to the various approaches for the fabrication of porphyrin polymers described above entails direct electrochemical polymerization of the appropriate porphyrin subunits (monomers). Giraudeau et al. demonstrated a convenient method for the electropolymerization of porphyrins that circumvents the difficulties associated with synthesizing a functional porphyrin monomer by directly employing a commercial zinc-β-octaethylporphyrin (ZnOEP) with 4,4'-bipyridine (bpy) in solution.[13] Gust et al. reported the in situ electropolymerization of porphyrins and porphyrin-[60]fullerene dyads to form conjugated porphyrin (and porphyrin-[60]fullerene-based) materials.[14-17] Overall, the absorption characteristics of the films resemble that of the corresponding porphyrin subunits, respectively, except for significant broadening of absorption peaks due to extended conjugation in the polymers.

FIGS. 3A through 3C respectively depict porphyrin dimers consisting of two free-base porphyrins (FIG. 3A), two zinc porphyrins (FIG. 3B), and one free-base porphyrin and one zinc porphyrin (FIG. 3C), whereby Im=imidazole (prior art). In contrast to methodologies that furnish extended, covalently-bonded porphyrin networks, the formation of porphyrin polymers has been successfully demonstrated through "self-assembly" of porphyrin monomers in solution. Michelsen et al. demonstrated the ability to control the self-assembly of polymers formed from cobalt porphyrins functionalized with two pyridine ligands.[18] Kobuke et al. described the design and synthesis of alkyne-linked, bis(imidazoyl)porphyrin complex (dimer) arrays that exhibited large, dual photon absorption characteristics.[19]

For some applications, it may be advantageous to provide an intimate association/communication between a porphyrin (polymer) and a substrate. For example, the substrate material may be a metal oxide such as $TiO_2$ (as in DSC), and a pristine metal nanoparticle or various forms/compositions of nanostructures that have been either deposited on a substrate or dispersed within a matrix. Conventionally, this association/communication may be accomplished by chemically installing a functional linker on the porphyrin polymer, substrate, or sometimes both. In effect, the linker promotes a degree of interaction (electronic or other) between the porphyrin polymer and substrate which is not similarly operative in the isolated systems. Ozawa et al. demonstrated the synthesis of conjugated gold nanoparticle-terminated porphyrin polymers through the reaction of thiol-terminated porphyrin polymers with gold nanoparticles.[20] Parsons provided a solar cell including a substrate having a horizontal surface and an electrode layer comprising a plurality of vertical surfaces, to which light-harvesting rods were coupled.[21] Furthermore, the light harvesting rods consist of extended porphyrin networks fabricated by thermally-facilitated polymerization of porphyrin subunits, where polymerization originated from the terminus of porphyrins that had been pre-deposited in the form of a self-assembled monolayer (SAM). Optionally, the porphyrin subunits may contain additional chemical functionalities that provide attachment to quantum dots. Finally, Bocian et al. provided a method for fabricating redox-active polymers attached to surfaces.[22] In certain embodiments, porphyrins (and/or metallocenes) are attached to a conductive substrate and can be oxidized upon applied voltage and subsequently store charge when the potential is removed, thereby providing the foundation of a memory storage device.

It would be advantageous to provide a substrate functionalized with a metalloporphyrin polymer in a more straightforward process than has been thus far demonstrated in the prior art.

1. F. O. Lenzmann and J. M. Kroon, "Recent Advances in Dye-Sensitized Solar Cells", *Advances in OptoElectronics* 2007, Article ID 65073.
2. C-Y. Chen, M. Wang, J-Y. Li, N. Pootrakulchote, L. Alibabaei, C-h. Ngoc-le, J-D. Decoppet, J-H. Tsai, C. Grätzel, C-G. Wu, S. M. Zakeeruddin and M. Grätzel, "Highly Efficient Light-Harvesting Ruthenium Sensitizer for Thin-Film Dye-Sensitized Solar Cells", *ACS Nano* 2009, 3, 3103-3109.
3. A. Yella, H-W. Lee, H. N. Tsao, C. Yi, A. K. Chandiran, M. K. Nazeeruddin, E. W-G. Diau, C-Y. Yeh, S. M. Zakeeruddin and M. Grätzel, "Porphyrin-Sensitized Solar Cells with Cobalt (II/III)-Based Redox Electrolyte Exceed 12 Percent Efficiency", *Science* 2011, 334, 629-633.
4. V. S-Y. Lin, S. G. DiMagno and M. J. Therien, "Highly Conjugated, Acetylenyl Bridged Porphyrins: New Models for Light-Harvesting Antenna Systems", *Science* 1994, 264, 1105-1111.

5. R. W. Wagner, T. E. Johnson, F. Li and J. S. Lindsey, "Synthesis of Ethyne-Linked or Butadiyne-Linked Porphyrin Arrays Using Mild, Copper-Free, Pd-Mediated Coupling Reactions", *Journal of Organic Chemistry* 1995, 60, 5266-5273.
6. M. J. Therien and S. G. DiMagno, "Metal-Mediated Cross-Coupling with Ring-Metalated Porphyrins", U.S. Pat. No. 5,986,090, 1999.
7. H. Chen, J. Zeng, F. Deng, X. Luo, Z. Lei and H. Li, "Synthesis and Photophysical Properties of Porphyrin-Containing Polymers", *Journal of Polymer Research* 2012, 19:9880.
8. K. Jyothish, Q. Wang and W. Zhang, "Highly Active Multidentate Alkyne Metathesis Catalysts: Ligand-Activity Relationship and Their Applications in Efficient Synthesis of Porphyrin-Based Aryleneethynylene Polymers", *Advanced Synthesis & Catalysis* 2012, 354, 2073-2078.
9. N. Xiang, Y. Liu, W. Zhou, H. Huang, X. Guo, Z. Tan, B. Zhao, P. Shen and S. Tan, "Synthesis and Characterization of Porphyrin-Terthiophene and Oligothiophene π-Conjugated Copolymers for Polymer Solar Cells", *European Polymer Journal* 2010, 46, 1084-1092.
10. S. Shi, X. Wang, Y. Sun, S. Chen, X. Li, Y. Li and H. Wang, "Porphyrin-Containing D-π-A Conjugated Polymer with Absorption Over the Entire Spectrum of Visible Light and Its Applications in Solar Cells", *Journal of Materials Chemistry* 2012, 22, 11006-11008.
11. I. Natori, S. Natori, A. Kanasashi, K. Tsuchiya and K. Ogino, "Synthesis of Porphyrin-End-Functionalized Poly (p-phenylene) as a Leaf-Green-Colored Soluble Semiconducting Polymer: Control of π-π Interactions for Visible-Light Absorption", *Reactive and Functional Polymers* 2013, 73, 200-206.
12. A-L. Wirotius, E. Ibarboure, L. Scarpantonio, M. Schappacher, N. D. McClenaghan and A. Deffieux, "Hydrosoluble Dendritic Poly(ethylene oxide)s with Zinc Tetraphenylporphyrin Branching Points as Photosensitizers", *Polymer Chemistry* 2013, 4, 1903-1912.
13. A. Giraudeau, D. Schaming, J. Hao, R. Farha, M. Goldmann and L. Ruhlmann, "A Simple Way for the Electropolymerization of Porphyrins", *Journal of Electroanalytical Chemistry* 2010, 638, 70-75.
14. P. A. Liddell, M. Gervaldo, J. W. Bridgewater, A. E. Keirstead, S. Lin, T. A. Moore, A. L. Moore and D. Gust, "Porphyrin-Based Hole Conducting Polymer", *Chemistry of Materials* 2008, 20, 135-142.
15. M. Gervaldo, P. A. Lidell, G. Kodis, B. J. Brennan, C. R. Johnson, J. W. Bridgewater, A. L. Moore, T. A. Moore and D. Gust, "A Photo- and Electrochemically-Active, Porphyrin Fullerene Dyad Electropolymer", *Photochemical & Photobiological Sciences* 2010, 9, 890-900.
16. J. D. Gust, P. A. Liddell, M. A. Gervaldo, J. W. Bridgewater, B. J. Brennan, T. A. Moore and A. L. Moore, "Electrically Conducting Porphyrin and Porphyrin-Fullerene Electropolymers", US2010/0065123 A1.
17. B. J. Brennan, P. A. Lidell, T. A. Moore, A. L. Moore and D. Gust, "Hole Mobility in Porphyrin and Porphyrin-Fullerene Electropolymers", *Journal of Physical Chemistry B* 2013, 117, 426-432.
18. U. Michelsen and C. A. Hunter, "Self-Assembled Porphyrin Polymers", *Angewandte Chemie International Edition* 2000, 39, 764-767.
19. Y. Kobuke and K. Ogawa, "Porphyrin Array Exhibiting Large Two Photon Absorption Property and Including, as Structural Unit, Bis(imidazolylporphyrin Metal Complex) Linked with Acetylenic Bond and the Derivative Thereof, and Method of Producing the Same", U.S. Pat. No. 7,022,840 B2, 2006.
20. H. Ozawa, M. Kawao, H. Tanaka and T. Ogawa, "Preparation of Long Conjugated Porphyrin Polymers with Gold Nanoparticles at Both Ends as Electronic and/or Photonic Molecular Wires", *Chemistry Letters* 2009, 38, 542-543.
21. G. Parsons, "Nano-Structured Photovoltaic Solar Cell and Related Methods", U.S. Pat. No. 7,655,860 B2, 2010.
22. D. F. Bocian, Z. Liu and J. S. Lindsey, "Procedure for Preparing Redox-Active Polymers on Surfaces", U.S. Pat. No. 8,231,941 B2, 2012.

SUMMARY OF THE INVENTION

Described herein is a strategy for "growing" poly-metalloporphyrin arrays (polymers) originating from a pre-deposited terminal alkyne-containing linker that also contains an anchor group to provide effective attachment to a substrate, for example, a metal oxide substrate such as titanium oxide ($TiO_2$). In general, both the methods for functionalization of the substrate by linker through the anchor group and polymerization protocols (to grow polymer arrays) are amenable to a large number of terminal alkyne-containing electroactive and/or photoactive monomer subunits such as metalloporphyrin materials. As used herein, functionalization refers to an attachment of a linker to a substrate through an anchor group, which may be characterized by covalent bonding, complexation, surface (physical) adsorption, and/or other modes of interaction between substrate and anchor group. A simplified illustration of the concept using zinc-2,12-di-ethynyltetraphenylporphyrin, zinc 5,15-di-ethynyl-10,20-di-phenylporphyrin and zinc 5,10,15,20-tetra-4-ethylphenylporphyrin as representative examples, with propiolic acid ($HC\equiv C-COOH$) as the linker (attached to $TiO_2$), is presented in the Detailed Description below.

Accordingly, a method is provided for fabricating a metalloporphyrin polymer on a substrate. The method creates a functionalized substrate by attaching an anchor group of a linker, including a terminal alkyne group, to a substrate surface. The functionalized substrate is then exposed to metalloporphyrin monomers, where each metalloporphyrin monomer includes at least two terminal alkyne groups. A plurality of metalloporphyrin monomers (e.g., zinc porphyrin monomers) are thus linked via the metalloporphyrin monomer terminal alkyne groups, forming a metalloporphyrin polymer attached to the substrate.

In one aspect, linking the plurality of metalloporphyrin monomers via the metalloporphyrin monomer terminal alkyne groups includes forming butadiyne groups between adjacent metalloporphyrins. Then, forming the metalloporphyrin polymer attached to the substrate includes attaching the metalloporphyrin polymer, via a metalloporphyrin monomer terminal alkyne group, to the terminal alkyne group of an associated linker. Alternatively stated, the metalloporphyrin polymer is attached to the substrate via a polyalkyne group.

Additional details of the above-described method and a metalloporphyrin polymer functionalized substrate are presented below.

DETAILED DESCRIPTION

Figure 1:
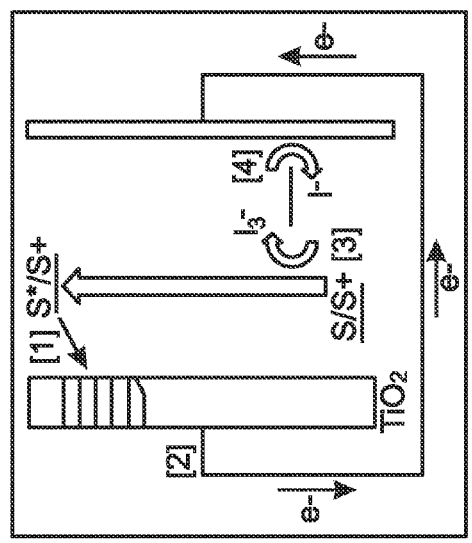
FIG. 1 is a simplified schematic of a dye-sensitized solar cell (DSC), depicting modes of operation (prior art).
Figure 2A:
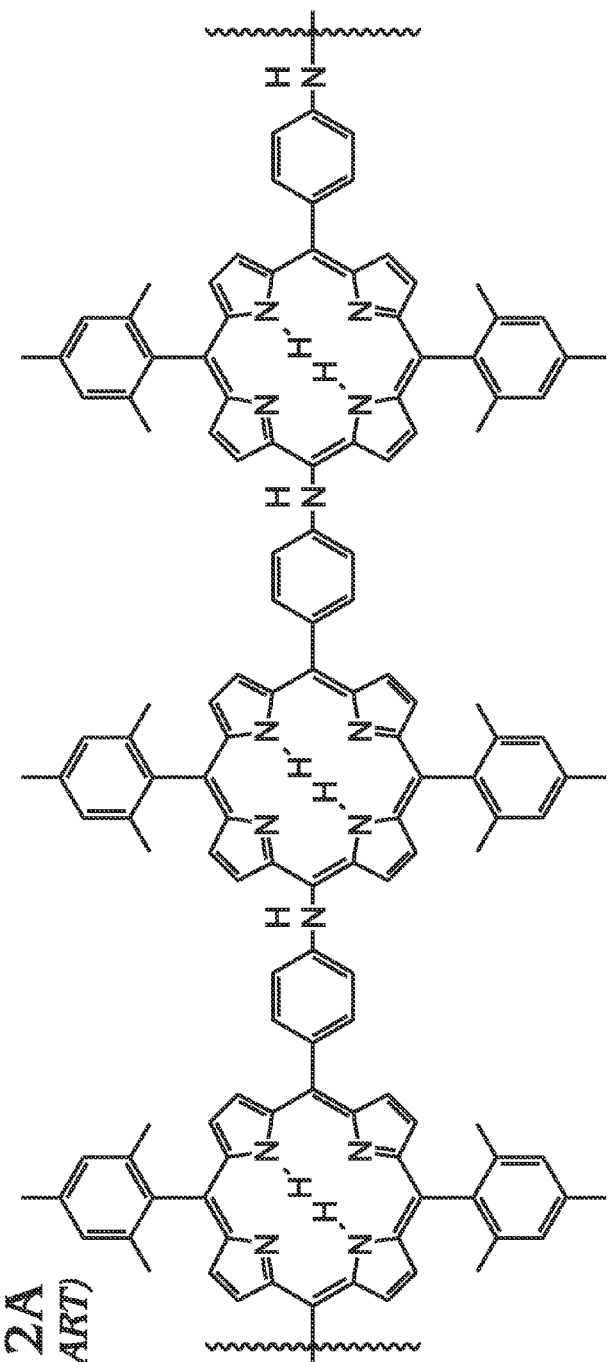
FIGS. 2A and 2B respectively depict the molecular structures of porphyrin and porphyrin-[60]fullerene polymers fabricated via electropolymerization (prior art).
Figure 2B:
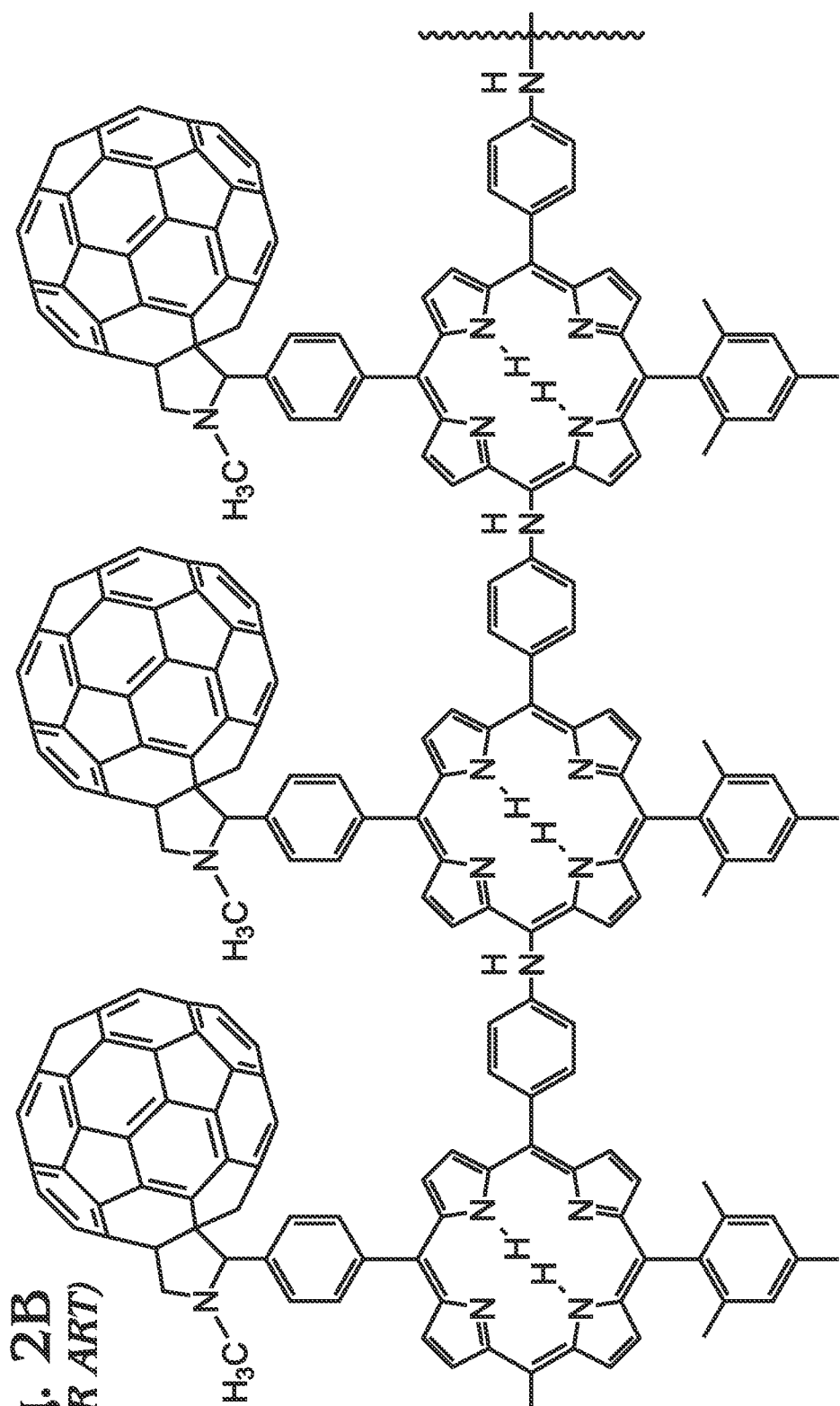
Figure 3A:
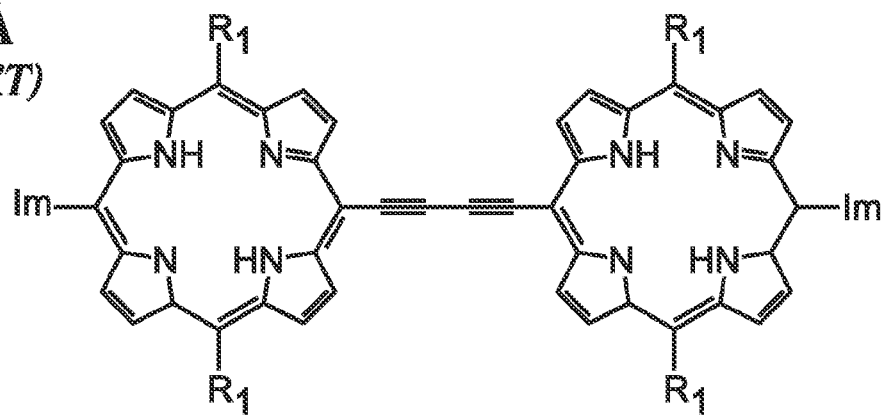
FIGS. 3A through 3C respectively depict porphyrin dimers consisting of two free-base porphyrins (FIG. 3A), two zinc porphyrins (FIG. 3B), and one free-base porphyrin and one zinc porphyrin (FIG. 3C), whereby Im=imidazole (prior art).
Figure 3B:
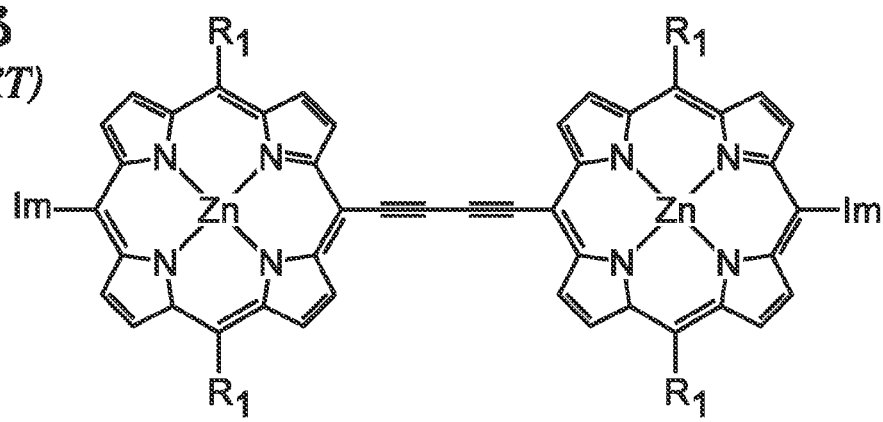
Figure 3C:
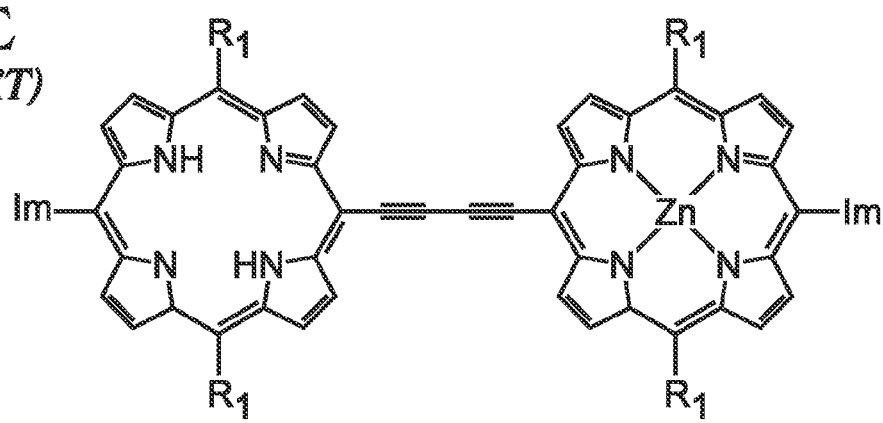
Figure 4:
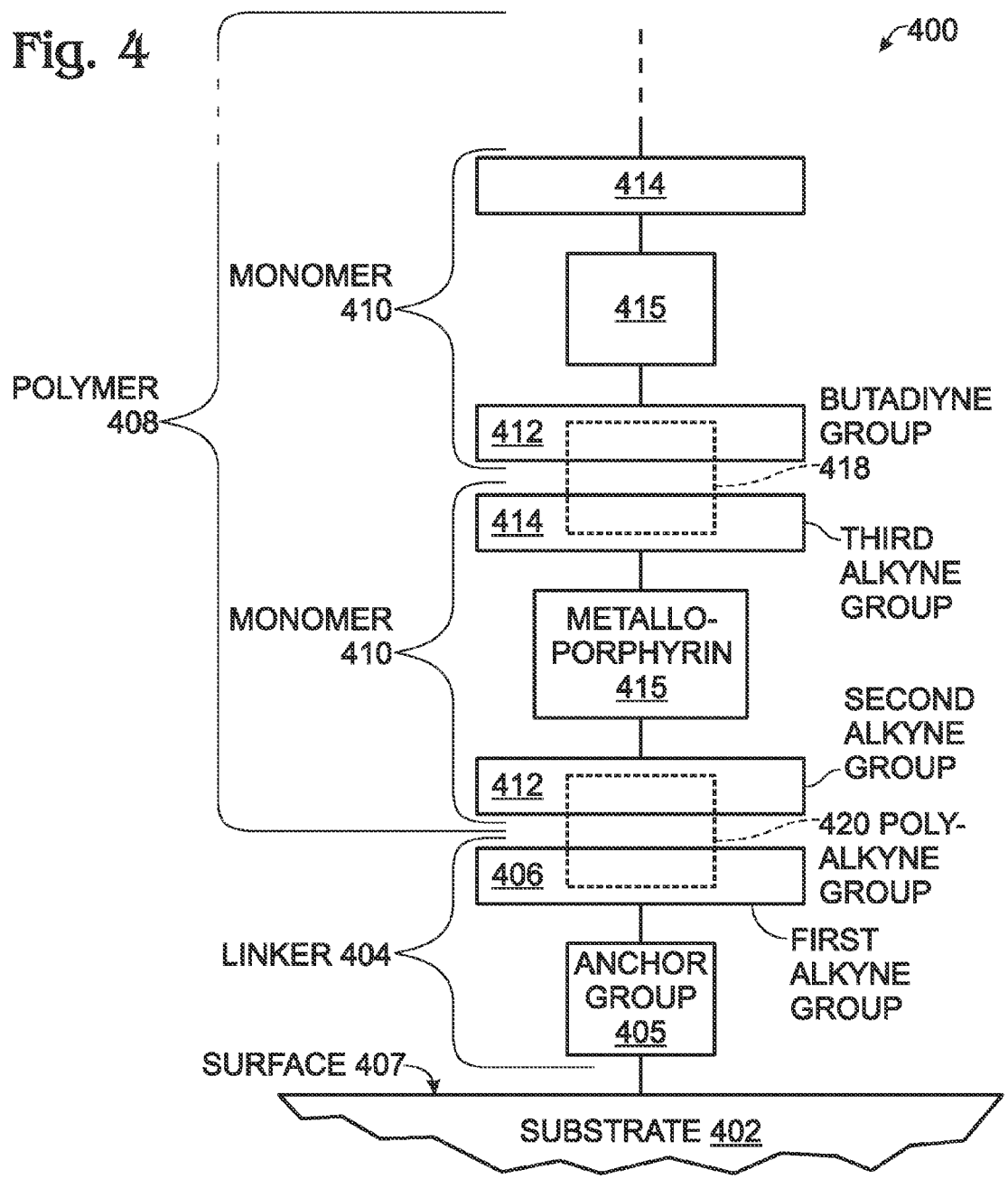
FIG. 4 is a schematic diagram depicting a metalloporphyrin polymer functionalized substrate.

FIG. 4 is a schematic diagram depicting a metalloporphyrin polymer functionalized substrate. The metalloporphyrin polymer functionalized substrate 400 comprises a substrate 402 and linkers 404 comprising an anchor group 405 attached to a surface 407 of the substrate 402. The substrate 402 may be a material such as metal oxide, mixed-metal oxide, semiconductor, or metal. The substrate 402 has a morphology that is either a film or particles suspended in a matrix, independent of shape. In turn, the film may comprise individual particles. As defined herein, a "matrix" is a material into which a substrate can be suspended (contained), and includes one or more solvents, mixtures of solvents, surfactants, etc. As used herein, a "solvent" is a first substance that dissolves a second substance to form a homogenous solution. Alternatively, the solvent may serve as a solution phase for suspending a second substance, although the second substance does not necessarily dissolve within the solvent. If the substrate is in the form of suspended particles, it may be subsequently processed to form a film.

Each linker 404 also includes a terminal first alkyne group 406. The first alkyne group 406 is defined as terminal since at least one carbon in the first alkyne group is bonded to a hydrogen atom (terminal) and therefore sufficiently chemically reactive towards the chemistries described herein. An alkyne group is an unsaturated hydrocarbon comprising at least one carbon-carbon triple bond between two carbon atoms.

Metalloporphyrin polymers 408 are attached to the linkers 404. The metalloporphyrin polymers 408 are comprised of a plurality of metalloporphyrin monomers 410, where each metalloporphyrin monomer 410 includes at least a second alkyne group 412 and a third alkyne group 414. For simplicity, metalloporphyrin monomer 410 is depicted as comprising at least second alkyne group 412, third alkyne group 414, and a metalloporphyrin molecule 415. A monomer is a molecule that chemically binds to other molecules to form a polymer. Alternatively stated, a polymer is a large molecule composed of many repeated subunits, known as monomers. As used herein, the second alkyne 412 and third alkyne group 414 are the same and are interchangeable. Each metalloporphyrin polymer 408 is attached to the terminal first alkyne group 406 of a linker 404 via a metalloporphyrin monomer second alkyne group 412. For simplicity, metalloporphyrin polymers 408 comprised of two metalloporphyrin monomers 410 are shown, but it should be understood that the polymer may be comprised of any number of monomers (greater than one). In one aspect, the metalloporphyrin polymers 408 include butadiyne groups 418 between adjacent metalloporphyrin monomers. Butadiyne (or diacetylene), with the formula $C_4H_2$, is an unsaturated hydrocarbon that contains three single bonds and two triple bonds. Alternatively stated, the butadiyne is comprised of a carbon-carbon triple bond from each of two adjacent alkyne groups.

The linker 404 is the moiety through which the metalloporphyrin polymer 408 attaches to the substrate 402. The linker 404 is essentially a molecule which comprises an anchor group 405 which is a chemical group that actually attaches to the substrate 402, through any number of modes described herein, and the terminal first alkyne group 406 that attaches to a second alkyne group 412 of a metalloporphyrin monomer 410. The linker 404 may consist of other chemical groups which form the "backbone" of the linker located between the anchor and the first terminal alkyne group. In other words, the linker 404 is molecule with anchor group 405 and terminal first alkyne group 412, and as a whole serves as the "bridge" between the metalloporphyrin polymer 408 and substrate 402. In one aspect, each metalloporphyrin polymer 408 is attached to the substrate 402 via a polyalkyne group 420. The polyalkyne group 420 is comprised of elements from the terminal first alkyne group 406 and second alkyne group 412. That is, a polyalkyne is defined herein as comprising two or more alkyne groups (—C≡C—) chemically bonded together.

In one aspect, the metalloporphyrin polymers 408 are formed from a plurality of metalloporphyrin monomer types, each metalloporphyrin monomer type comprising the same metal. In one example, the metalloporphyrin polymers 408 are zinc porphyrin polymers. Alternatively stated, the metalloporphyrin monomers 410 are zinc porphyrin monomers. See FIGS. 5A-5C for examples of different types of zinc porphyrin monomer types. In another aspect, the metalloporphyrin polymers 408 are formed from a plurality of metalloporphyrin monomer types, each metalloporphyrin type comprising a different metal. In general, the preferred choice of metals includes transition metals. A transition metal is an element whose atom has an incomplete d sub-shell or which is capable of forming cations with an incomplete d sub-shell. Furthermore, transition metals include groups 3 through 12 of the Periodic Table. Some examples of suitable transition metals include copper (Cu), nickel (Ni), cobalt (Co), iron (Fe), etc.

Figure 5A:
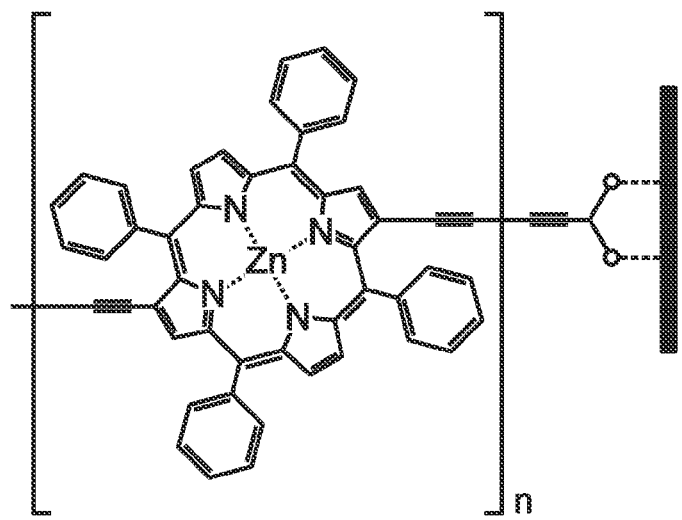
FIGS. 5A through 5C are representative porphyrin polymer arrays based, respectively, upon monomers of zinc-2,12-di-ethynyltetraphenylporphyrin (FIG. 5A), zinc 5,15-di-ethynyl-10,20-di-phenylporphyrin (FIG. 5B) and zinc 5,10, 15,20-tetra-4-ethylphenylporphyrin (FIG. 5C) as representative examples, with propiolic acid as the linker.
Figure 5B:
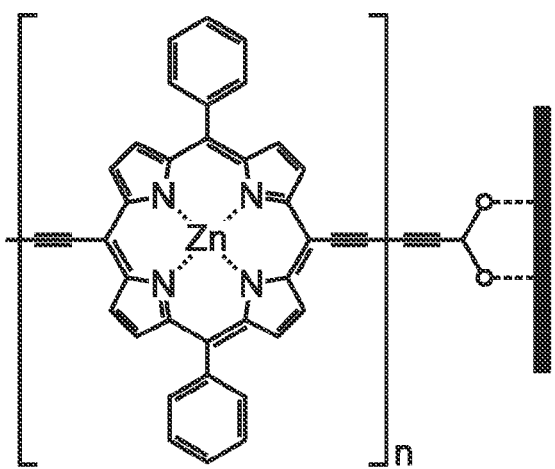
Figure 5C:
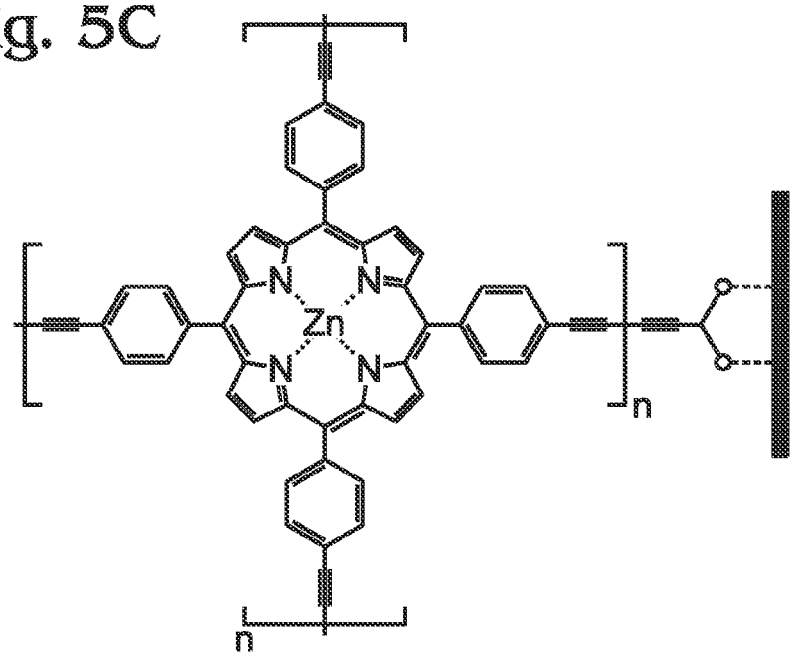

FIGS. 5A through 5C are representative porphyrin polymer arrays based, respectively, upon monomers of zinc-2,12-di-ethynyltetraphenylporphyrin (FIG. 5A), zinc 5,15-di-ethynyl-10,20-di-phenylporphyrin (FIG. 5B) and zinc 5,10, 15,20-tetra-4-ethylphenylporphyrin (FIG. 5C) as representative examples, with propiolic acid as the linker. In the case of propiolic acid, a carboxylic acid group serves as the anchor group for attachment to a metal oxide substrate ($TiO_2$).

In general, the technology can be summarized by the following statements. A linker 404 or linker moiety is attached to a substrate 402. The substrate 402 may be a metal oxide, mixed-metal oxide, silicon, or metal. The substrate 402 may be either deposited as a film or may be provided as a suspension (dispersion) in a matrix. The linker 404 may attach to the substrate 402 through an anchor group 405, which may comprise carboxylate, sulfonate, phosphonate, succinimate, 2-cyanoacrylate, silanes, etc. (for metal oxide substrate), silane (silicon substrate) or thiols (gold), as examples. Furthermore, the linker 404 has a terminal first alkyne group 406, which is oriented substantially away from the substrate 402 and serves as the point from which polymerization of metalloporphyrin monomers 410 (to afford metalloporphyrin polymer 408) evolves. In an optional aspect, an appropriate co-adsorbent is employed in combination with the alkyne-containing linker at this stage. Although the co-adsorbent makes no absorption or electronic contributions per se, it effectively serves as a "spacer" between adjacent linkers 404 on the substrate surface 407. The co-adsorbent does not contain reactive terminal alkyne groups and therefore does participate in the polymerization process among the porphyrin monomers 410 during construction of the metalloporphyrin polymer arrays 408.

A metalloporphyrin material (monomer) 410 is provided that comprises at least two terminal alkyne groups (412/414). In one case, the metalloporphyrin is a zinc porphyrin. Initially, one alkyne group 412 of the metalloporphyrin monomer 410 reacts with the terminal alkyne group 406 of the linker 404. The remaining alkyne group 414, or other alkyne groups (not shown), on the metalloporphyrin monomer 410 serves as the source of metalloporphyrin polymer chain propagation, upon reaction with additional metalloporphyrin monomers 410. Owing to the two alkyne groups 412/414 (or at least 2 alkyne groups) in the metalloporphyrin monomers 410, chain propagation can readily proceed. Assembly of the metalloporphyrin polymer proceeds either at room temperature or facilitated by warming, and consists of metalloporphyrin polymer 408 formation in solution as well as from the substrate 402 (through the linker 404). Fortunately, metalloporphyrin dimers, trimers, and oligomers formed in solution are capable of participating in growth of the polymer 408 evolving from the surface of the substrate 402.

Ultimately, the technology affords a metalloporphyrin polymer 408 prepared by reacting alkyne-containing metalloporphyrin monomers 410 with an alkyne containing linker 404 pre-functionalized to the surface of a substrate 402. By pre-functionalized, it is meant that the substrate is functionalized with the linker prior to exposure to porphyrin monomers and proceeding with metalloporphyrin polymerization to yield metalloporphyrin polymer 408. Overall, the metalloporphyrin polymer 408 consists of metalloporphyrin monomers 410 linked together through butadiyne groups 418 between adjacent metalloporphyrin monomers in the polymer 408.

From a process standpoint, a substrate 402 is functionalized by a linker 404, which can be accomplished by exposing the substrate (or treating the substrate) with the linker dissolved in a matrix (solvent). Next, the substrate 402 is treated with a solution (performed by submerging substrate in solution) of metalloporphyrin monomers 410 dissolved in solvent in the presence of a copper-containing material and an amine (to cause polymerization). Amines are organic compounds and functional groups that contain a basic nitrogen atom with a lone pair. Amines are derivatives of ammonia, wherein one or more hydrogen atoms have been replaced by a substituent such as an alkyl or aryl group. In one case, the copper-containing material may be a metal halide (such as copper(I) chloride, CuCl) and the amine may be N,N,N'N'-tetramethylethylenediamine (TMEDA). The term "N" is used herein as in accordance with the International Union of Pure and Applied Chemistry (IUPAC) system of nomenclature. A metal halide is a binary compound, of which one part is a halogen atom (fluorine, bromine, chlorine, and/or iodine) and the other part is metal. In another case, the copper-containing material may be copper(II) acetate ($Cu(C_2H_3O_2^-)_2$) and the amine may be pyridine or a pyridine analogue. Pyridine is a basic heterocyclic organic compound with the chemical formula $C_5H_5N$. The polymerization may proceed at ambient temperature or at slightly elevated temperatures (50-60° C.). Furthermore, the polymerization may proceed in the presence of a bisamine-containing material such as 1,4-diazabicyclo[2.2.2]octane (DABCO), 4,4'-bipyridyl (Bipy) and/or a pyrazine ($C_4H_4N_2$) material. A bisamine or bis-amine material is characterized by two amine groups (same or different) contained in the same molecule.

One advantage of this strategy is that it overcomes the issues associated with the functionalization of substrates with large oligomeric and/or polymeric materials, which often proves difficult due to both steric and solubility factors. Furthermore, the technology circumvents the practical challenges that arise from insolubility of metalloporphyrin polymers.

Figure 6A:
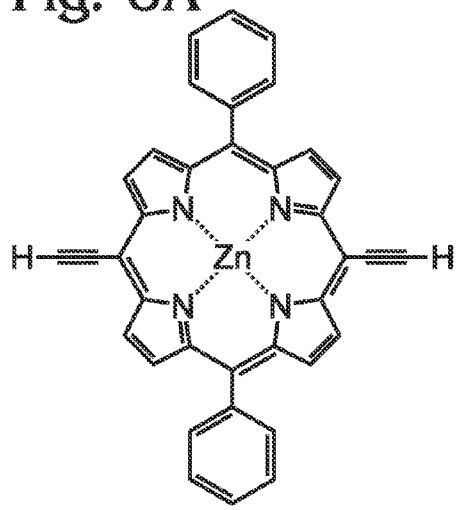
FIGS. 6A through 6D are four exemplary metalloporphyrin monomers that can be employed for fabricating metalloporphyrin polymers attached to a substrate.
Figure 6B:
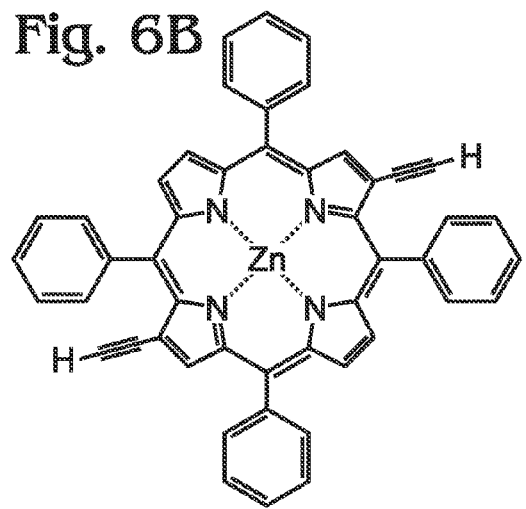
Figure 6C:
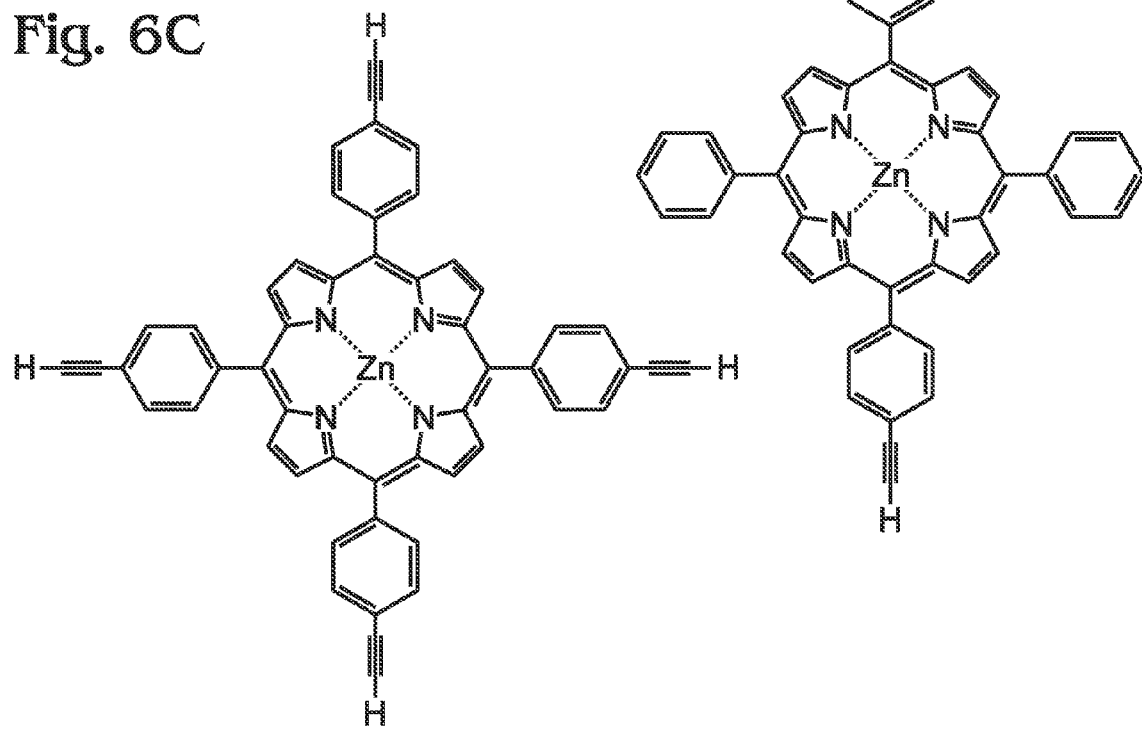
Figure 6D:
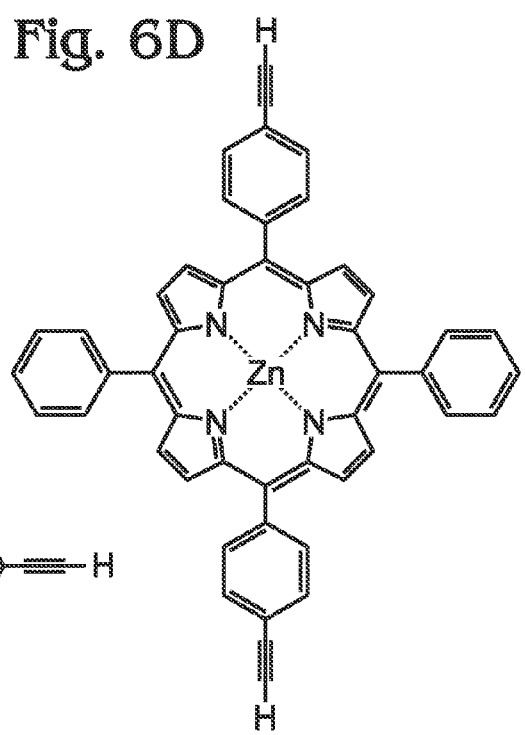

FIGS. 6A through 6D are four exemplary metalloporphyrin monomers that can be synthesized using conventional protocols. These metalloporphyrins can be used in the polymerization process described herein. Explicitly, FIG. 6A represents zinc 5,15-di-ethynyl-10,20-di-phenylporphyrin, FIG. 6B zinc-2,12-di-ethynyltetraphenylporphyrin, FIG. 6C zinc 5,10,15,20-tetra-4-ethylphenylporphyrin, and FIG. 6D zinc 5,15-di-4-ethynylphenyl-10,20-di-phenylporphyrin.

Proof of Concept Demonstration:

It has been successfully demonstrated that a metalloporphyrin polymer array can be "grown" systematically from a pre-deposited terminal alkyne-containing linker attached to $TiO_2$ (as an example substrate). For proof of concept, a glass platform underlying a transparent, nanoparticulate $TiO_2$ film (substrate) was soaked in an ethanolic solution of propiolic acid (H—C≡C—COOH) to afford a $TiO_2$-nanoparticle layer (substrate) functionalized with propiolic acid. The substrate was rinsed with ethanol and subsequently immersed into a solution of zinc-tetra-4-ethynylphenylporphyrin (Zn-tetra-CC-H-TPP, see FIG. 6C). Finally, a solution of copper (II) acetate ($Cu(C_2H_3O_2^-)_2$) in pyridine was added to initiate the "polymerization" process. The metalloporphyrin polymer modified substrate (on glass) was removed from solution after two hours at room temperature and rinsed.

Figure 7:
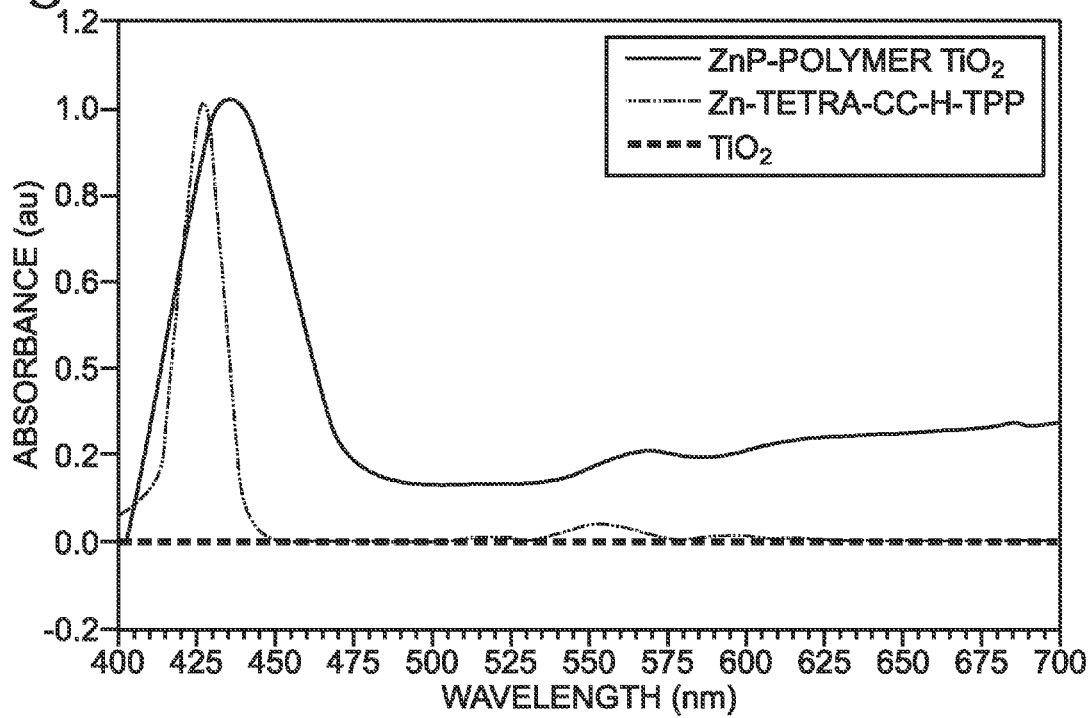
FIG. 7 is a graph depicting the optical absorption spectra for zinc 5,10,15,20-tetra-4-ethylphenylporphyrin (Zn-tetra-CC-H-TPP monomer) dissolved in chloroform, its corresponding zinc porphyrin polymer attached to $TiO_2$ substrate (ZnP-Polymer-$TiO_2$), and a pristine, transparent $TiO_2$ nanoparticulate film (substrate) as control.

FIG. 7 is a graph depicting the optical absorption spectra for Zn-tetra-CC-H-TPP (monomer) dissolved in chloroform, its corresponding zinc porphyrin polymer attached to $TiO_2$ (ZnP-Polymer-$TiO_2$), and a pristine, transparent $TiO_2$ nanoparticulate film (substrate) as control. The absorbance for ZnP-Polymer-$TiO_2$ and Zn-tetra-CC-H-TPP are normalized to ~1.0 for the metalloporphyrin Soret band [y-axis: absorbance in arbitrary units (au); x-axis: wavelength in nanometers (nm)]. As can be seen from the figure, the absorption spectrum for Zn-tetra-CC-H-TPP (zinc porphyrin monomer) is characterized by strong yet narrow absorption for the Soret band ($\lambda_{max}$=426 nm, sharp) and weak absorption for the Q-bands ($\lambda_{max}$=554 and 596 nm) bands. In contrast, the $TiO_2$ substrate functionalized with a zinc porphyrin polymer (ZnP-Polymer-$TiO_2$) exhibits strong, broad absorption for both the Soret ($\lambda_{max}$=435 nm) and lower energy Q-bands ($\lambda_{max}$>525 nm). Based upon the lack of absorbance for $TiO_2$ at wavelengths greater than 400 nm, it can be asserted that the enhanced optical absorption properties are attributable to the zinc porphyrin polymer attached to $TiO_2$ (ZnP-Polymer-$TiO_2$).

Figure 8:
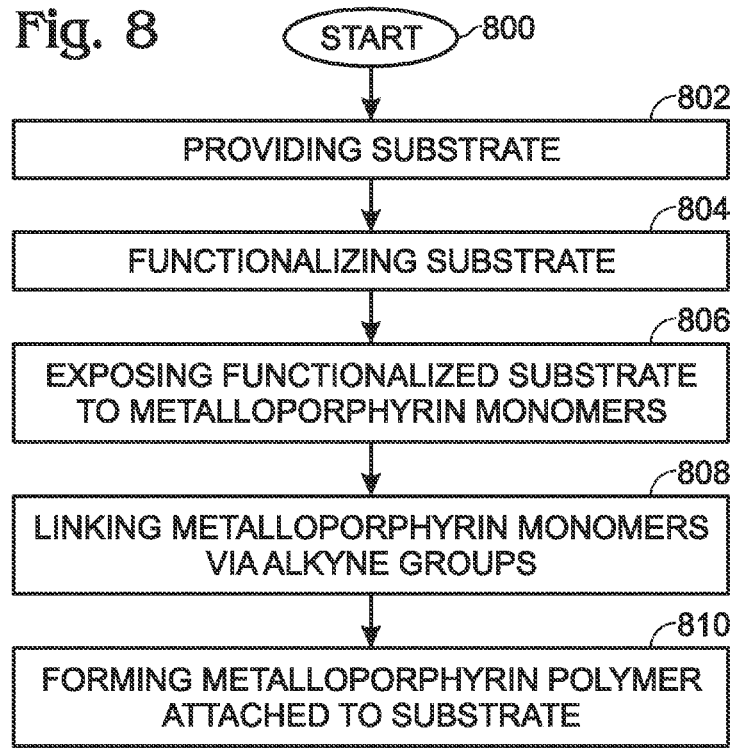
FIG. 8 is a flowchart illustrating a method for fabricating a metalloporphyrin polymer on a substrate.
Figure 9A:
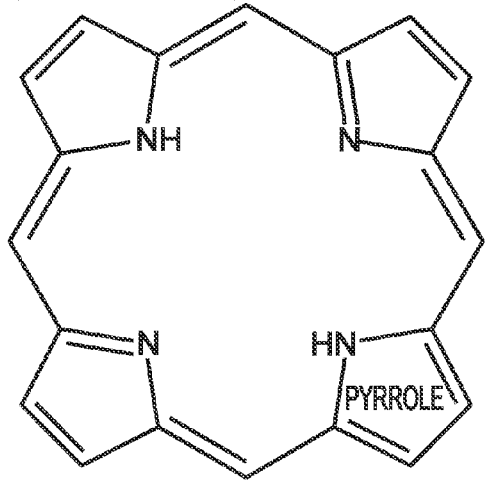
FIGS. 9A and 9B respectively depict schematics of porphyrin and metalloporphyrin molecules (prior art).
Figure 9B:
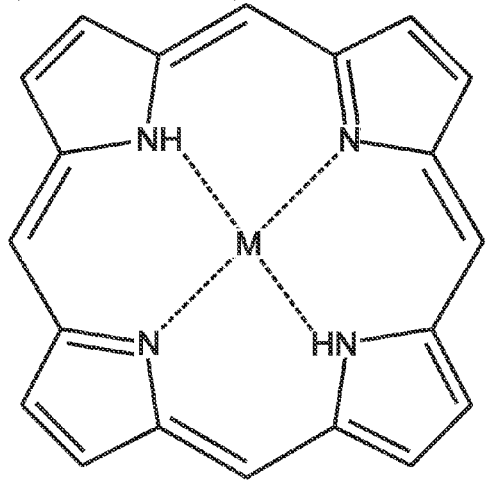

FIG. 8 is a flowchart illustrating a method for fabricating a metalloporphyrin polymer on a substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides a substrate. The substrate material may, for example, be a metal oxide, mixed-metal oxide, semiconductor, or metal. Step 802 may provide the substrate in the form of a film, or in the form of particles suspended in a matrix. Step 804 creates a functionalized substrate by attaching the anchor group of a linker, including a terminal first alkyne group, to a surface of the substrate. For example, the substrate may be exposed to a linker dissolved in a solvent.

Step 806 exposes the functionalized substrate to metalloporphyrin monomers, where each metalloporphyrin monomer includes at least a terminal second alkyne group and a terminal third alkyne group. In one aspect, Step 806 exposes the functionalized substrate to zinc porphyrin monomers. In another aspect, Step 806 exposes the functionalized substrate to metalloporphyrin monomers dissolved in a solvent in the presence of a copper-containing material and an amine. For example, metalloporphyrin monomers may be dissolved in a solvent with the additional presence of a bisamine-containing material. Step 808 links a plurality of metalloporphyrin monomers via the metalloporphyrin monomer terminal second and third alkyne groups. Step 810 forms a metalloporphyrin polymer attached to the substrate.

In one aspect, linking the plurality of metalloporphyrin monomers via the metalloporphyrin monomer terminal second and third alkyne groups in Step 808 includes forming butadiyne groups between adjacent metalloporphyrins. Then, forming the metalloporphyrin polymer attached to the substrate in Step 810 includes attaching the metalloporphyrin polymer, via a metalloporphyrin monomer terminal second alkyne group, to the terminal first alkyne group of an associated linker. Alternatively stated, Step 810 attaches the metalloporphyrin polymer to the substrate via a polyalkyne group.

In one aspect, exposing the functionalized substrate to metalloporphyrin monomers in Step 806 includes exposing the functionalized substrate to a plurality of metalloporphyrin monomer types, each metalloporphyrin monomer type comprising the same metal. Alternatively, Step 806 exposes the functionalized substrate to a plurality of metalloporphyrin monomers types, each metalloporphyrin monomer type comprising a different metal.

A metalloporphyrin polymer functionalized substrate and associated synthesis method have been provided. Examples of particular substrates, reagents, and process variables have been presented to illustrate the invention. However, the invention is not limited to merely these examples. Other variations and embodiments of the invention will occur to those skilled in the art.

We claim:

1. A method for fabricating a metalloporphyrin polymer on a substrate, the method comprising:
providing a substrate;
creating a functionalized substrate by attaching an anchor group of a linker, including a terminal first alkyne group, to a surface of the substrate;
exposing the functionalized substrate to metalloporphyrin monomers, where each metalloporphyrin monomer includes at least a terminal second alkyne group and a terminal third alkyne group;
linking a plurality of metalloporphyrin monomers via the metalloporphyrin monomer terminal second and third alkyne groups; and,
forming a metalloporphyrin polymer attached to the substrate.

2. The method of claim 1 wherein providing the substrate includes providing a substrate material selected from a group consisting of metal oxide, mixed-metal oxide, semiconductor, and metal.

3. The method of claim 1 wherein providing the substrate includes providing the substrate in the form of a film.

4. The method of claim 1 wherein exposing the functionalized substrate to metalloporphyrin monomers includes exposing the functionalized substrate to zinc porphyrin monomers.

5. The method of claim 1 wherein linking the plurality of metalloporphyrin monomers via the metalloporphyrin monomer terminal second and third alkyne groups includes forming butadiyne groups between adjacent metalloporphyrins; and,
wherein forming the metalloporphyrin polymer attached to the substrate includes attaching the metalloporphyrin polymer, via a metalloporphyrin monomer terminal second alkyne group, to the terminal first alkyne group of an associated linker.

6. The method of claim 1 wherein forming the meta porphyrin polymer attached to the substrate includes attaching the metalloporphyrin polymer to the substrate via a polyalkene group.

7. The method of claim 1 wherein exposing the functionalized substrate to metalloporphyrin monomers includes exposing the functionalized substrate to a plurality of metalloporphyrin monomer types, each metalloporphyrin monomer type comprising the same metal.

8. The method of claim 1 wherein attaching the linker to the substrate includes exposing the substrate to a linker dissolved in a solvent.

9. The method of claim 1 wherein exposing the functionalized substrate to metalloporphyrin monomers includes exposing the functionalized substrate to metalloporphyrin monomers dissolved in a solvent in the presence of a copper-containing material and an amine.

10. The method of claim 9 wherein exposing the functionalized substrate to metalloporphyrin monomers dissolved in the solvent in the presence of a copper-containing material and an amine includes dissolving the metalloporphyrin monomers in a solvent with an additional presence of a bisamine-containing material.

* * * * *

UNITED STATES PATENT AND TRADEMARK OFFICE
CERTIFICATE OF CORRECTION

PATENT NO. : 9,090,743 B2
APPLICATION NO. : 13/952535
DATED : July 28, 2015
INVENTOR(S) : Sean Vail et al.

It is certified that error appears in the above-identified patent and that said Letters Patent is hereby corrected as shown below:

In the claims

In column 12, at line 33, claim 6, the word term "metallopor-" has been incorrectly printed as "meta por-".

Claim 6 should read as follows:

6. The method of claim 1 wherein forming the metalloporphyrin polymer attached to the substrate includes attaching the metalloporphyrin polymer to the substrate via a polyalkyne group.

Signed and Sealed this
Twenty-fourth Day of November, 2015

Michelle K. Lee
*Director of the United States Patent and Trademark Office*